United States Patent
Goss et al.

(10) Patent No.: US 9,226,398 B1
(45) Date of Patent: Dec. 29, 2015

(54) PRINTED CIRCUIT BOARD AND PACKAGE SUBSTRATE HAVING ADDITIONAL CONDUCTIVE PATHWAY SPACE

(71) Applicant: Marvell International Ltd., Hamilton (BM)

(72) Inventors: Steven M. Goss, Corvallis, OR (US); Roger N. Switzer, Vancouver, WA (US); Yinfei Song, Shanghai (CN)

(73) Assignee: Marvell International Ltd., Hamilton (BM)

( * ) Notice: Subject to any disclaimer, the term of this patent is extended or adjusted under 35 U.S.C. 154(b) by 175 days.

(21) Appl. No.: 13/937,104

(22) Filed: Jul. 8, 2013

Related U.S. Application Data

(60) Provisional application No. 61/669,398, filed on Jul. 9, 2012.

(51) Int. Cl.
  *H05K 7/10* (2006.01)
  *H05K 7/12* (2006.01)
  *H05K 1/11* (2006.01)
  *H05K 1/18* (2006.01)

(52) U.S. Cl.
  CPC .............. *H05K 1/111* (2013.01); *H05K 1/181* (2013.01)

(58) Field of Classification Search
  USPC .......................................... 361/767; 174/261
  See application file for complete search history.

(56) References Cited

U.S. PATENT DOCUMENTS

| | | | |
|---|---|---|---|
| 5,541,450 A * | 7/1996 | Jones et al. | 257/697 |
| 2003/0116866 A1 * | 6/2003 | Cher 'Khng et al. | 257/780 |
| 2012/0248616 A1 * | 10/2012 | Kitajima et al. | 257/772 |

* cited by examiner

*Primary Examiner* — Andargie M Aychillhum

(57) ABSTRACT

In an embodiment, a printed circuit board includes a number of bond pads formed on a surface of the printed circuit board. At least a portion of the number of bond pads is arranged in an array of bond pads that includes a number of rows and a number of columns. A first portion of the number of rows include a number of adjacent rows having a first pitch and a second portion of the number of rows include at least one pair of adjacent rows having a second pitch different from the first pitch. In an embodiment, the second pitch is greater than 0.5 mm and less than 1.5 mm. In some embodiments, the array of bond pads can include at least one row of no-connect bond pads.

20 Claims, 3 Drawing Sheets

300

| | 1 | 2 | 3 | 4 | 5 | 6 | 7 | 8 | 9 |
|---|---|---|---|---|---|---|---|---|---|
| A | VDDQ | DQ13 | DQ15 | | | | DQ12 | VDDQ | VSS |
| B | VSSQ | VDD | VSS | | | | nUDQS | DQ14 | VSSQ |
| C | VDDQ | DQ11 | DQ9 | | | | UDQS | DQ10 | VDDQ |
| D | VSSQ | VDDQ | UDM | | | | DQ8 | VSSQ | VDDQ |
| E | NC | NC | NC | | | | NC | NC | NC |
| F | VSS | VSSQ | DQ0 | | | | LDM | VSSQ | VDD |
| G | VDDQ | DQ2 | LDQS | | | | DQ1 | DQ3 | VSSQ |
| H | VSSQ | DQ6 | nLDQS | | | | VDD | VSS | VSSQ |
| J | VREFDQ | VDDQ | DQ4 | | | | DQ7 | DQ5 | VDDQ |
| K | NC | VSSQ | nRAS | | | | CK | VSS | NC |
| L | ODT | VDD | nCAS | | | | nCK | VSS | NC |
| M | NC | nCS | nWE | | | | A10 | ZQ | NC |
| N | VSS | BA0 | BA2 | | | | A15 | VREFCA | VSS |
| P | VDD | A3 | A0 | | | | A12 | BA1 | VDD |
| R | NC | NC | NC | | | | NC | NC | NC |
| T | VSS | A5 | A2 | | | | A1 | A4 | VSS |
| U | VDD | A7 | A9 | | | | A11 | A6 | VDD |
| V | VSS | nRESET | A13 | | | | A14 | A8 | VSS |

FIG. 3

PRINTED CIRCUIT BOARD AND PACKAGE SUBSTRATE HAVING ADDITIONAL CONDUCTIVE PATHWAY SPACE

CROSS-REFERENCE TO RELATED APPLICATION

This application claims priority to U.S. Provisional Patent Application No. 61/669,398, filed on Jul. 9, 2012, which is incorporated herein by reference.

TECHNICAL FIELD

This disclosure relates to printed circuit boards, and package substrates for coupling one or more chips to printed circuit boards. More specifically, this disclosure relates to an arrangement of bonding articles on a package substrate, and a corresponding array of bond pads on a printed circuit board that provides additional space for conductive pathways on the printed circuit board.

BACKGROUND

An integrated chip (also referred to as a "chip" or "die") is a set of electronic circuits fabricated on a semiconductor material such as, for example, silicon. A chip can be mounted to a printed circuit board using a support structure. The support structure is generally referred to as a "package" that electrically couples one or more chips to features on the printed circuit board. Chips can be configured as, for example, processors, memory, system on chip (SOC), etc.

In some cases, a printed circuit board can include an arrangement of bond pads that corresponds to an arrangement of bonding articles on a package substrate that is to be attached to the printed circuit board. The bond pads can be electrically coupled to specified locations on the printed circuit board using conductive pathways, such as trace lines that include at least one suitable conductive material, such as copper. For example, the bond pads can be coupled to a supply voltage, to ground, to a reference voltage, to a particular node on a chip, and so forth. In some situations, the arrangement of conductive pathways of the printed circuit board, the size of the printed circuit board, the length of the conductive pathways of the printed circuit board, and the features of the printed circuit board (e.g., number of layers, via formation techniques, fabrication materials) can depend on the arrangement of bonding articles on the package substrate.

SUMMARY

In accordance with an embodiment, an apparatus includes a printed circuit board having a number of bond pads formed on a surface of the printed circuit board. At least a portion of the bond pads are arranged in an array of bond pads. The array of bond pads has a number of rows and a number of columns. In addition, respective bond pads of adjacent rows of the number of rows of the array of bond pads have a pitch of at least 0.4 mm and no greater than 0.8 mm. Further, the array of bond pads includes at least a first row of no-connect bond pads and optionally a second row of no-connect bond pads.

Additionally, in accordance with an embodiment, a printed circuit board includes a number of bond pads formed on a surface of the printed circuit board. The array of bond pads has a number of rows and a number of columns. The first portion of the number of rows includes a number of adjacent rows with the number of adjacent rows having a first pitch. In addition, a second portion of the number of rows includes at least one pair of adjacent rows with the at least one pair of adjacent rows having a second pitch that is different from the first pitch. The second pitch is greater than 0.5 mm and less than 1.5 mm.

Further, in accordance with an embodiment, a printed circuit board includes a number of bond pads formed on a surface of the printed circuit board with at least a portion of the number of bond pads being arranged in an array of bond pads. The array of bond pads has a number of rows and a number of columns and respective bond pads of adjacent rows of the number of rows of the bond pads have a pitch less than 0.8 mm. The printed circuit board also includes a number of conductive pathways coupled to a portion of the bond pads of the array of bond pads.

BRIEF DESCRIPTION OF THE DRAWINGS

Embodiments of the present disclosure will be readily understood by the following detailed description in conjunction with the accompanying drawings. To facilitate this description, like reference numerals designate like elements.

FIG. 3 is a diagram illustrating a view of a bonding article array that modifies the requirements of the DDR3 industry standard in accordance with an embodiment which provides additional conductive pathways on a printed circuit board.

DETAILED DESCRIPTION

Figure 1:
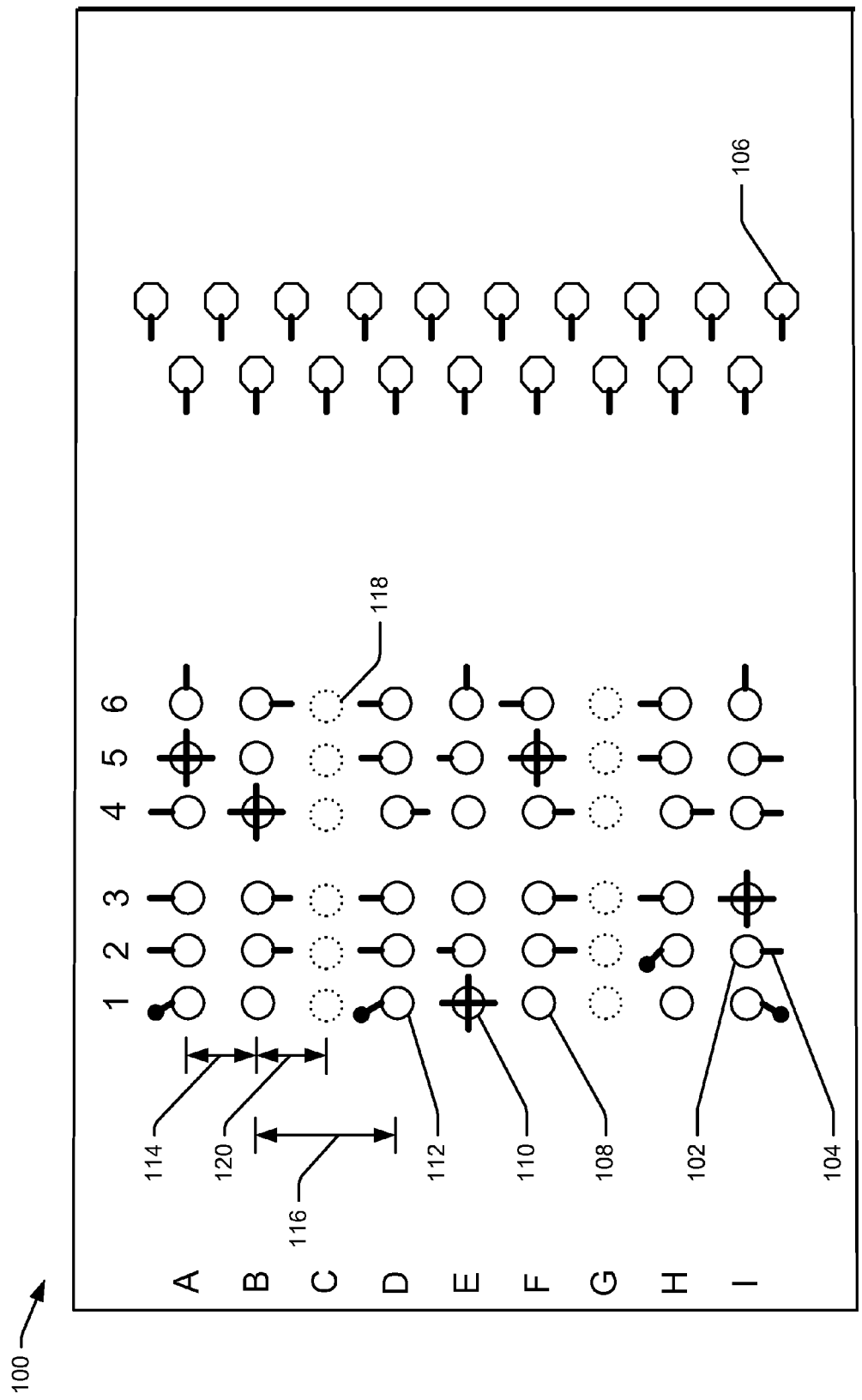
FIG. 1 is a diagram illustrating features of a printed circuit board including an array of bond pads having a spacing that provides additional space for conductive pathways in accordance with an embodiment.

Described herein are example systems, components, and techniques directed to a printed circuit board having an arrangement of bond pads that provides additional space for conductive pathways. The following description merely provides examples and is in no way intended to limit the disclosure, its application, or uses.

Printed circuit boards can have a number of layers and a number of features formed on or within the layers, such as vias, conductive pathways, bond pads, and the like. In some situations, the cost of the printed circuit board can depend on the features formed with respect to the printed circuit board and the techniques utilized to manufacture the printed circuit board. For example, the number of layers included in a circuit board can contribute to the cost of the printed circuit board. Additional features of the printed circuit board can also contribute to an increased cost, such as via in pad, laser microvias, and fine line geometries for conductive pathways of the printed circuit board.

When a ball grid array package substrate is coupled to a printed circuit board, the arrangement of bond pads on the printed circuit board can depend, in some situations, on the arrangement of bonding articles on the package substrate. For example, the printed circuit board can include a bond pad that corresponds to each bonding article of the package substrate. The bonding articles of the package substrate can be used to couple the package substrate to the printed circuit board. In some embodiments, the bonding articles can include a metal, and in a particular embodiment, the bonding articles can include solder balls.

Additionally, the arrangement of bonding articles of a package substrate and the electrical connections for the bonding articles can be based on an industry standard. For example, the number of bonding articles and the electrical connections for the bonding articles of a package substrate including a double data rate (DDR) synchronous dynamic random access memory (SDRAM) chip are based on a DDRx industry standard, where x is the technology generation. The DDRx industry standard specifies a minimum number of bonding articles to be formed on a package substrate having a DDR memory chip, such as 78 bonding articles, 86 bonding articles, or 96 bonding articles. The DDRx industry standard also specifies the electrical connections for the bonding articles. In particular, the DDRx industry standard specifies whether a particular bonding article is electrically connected to ground, a reference voltage, a supply voltage, or to a conductive pathway carrying a type of signal, such as a clock signal, a data signal, and the like. Thus, in some situations, the arrangement of bond pads and the bond pad connections on a printed circuit board can be specified by the arrangement of bonding articles and their respective electrical connections that are specified by the industry standard. Accordingly, the features of a printed circuit board can depend on the arrangement of bonding articles on the package substrate necessitated by the industry standard, which can affect the cost of the printed circuit board.

In some situations, decreasing costs associated with fabricating a printed circuit board can be limited due to the requirements of an industry standard for a package substrate coupled to the printed circuit board. For example, a reduction in the size of the printed circuit board and the reduction in the length of the conductive pathways of the printed circuit board can be limited due to the requirements of an industry standard. To illustrate, reducing the pitch between the bonding articles of a DDR3 package substrate to less than 0.8 mm may not provide sufficient space on the printed circuit board for the conductive pathways that make the electrical connections assigned to the particular bonding articles of the package substrate based on the industry standard without utilizing more expensive printed circuit board fabrication techniques.

This disclosure is directed to a package substrate having an array of bonding articles that provides additional space for conductive pathways on a printed circuit board coupled to the package substrate, while at the same time reducing the pitch on the package substrate and on the printed circuit board. By forming an array of bonding articles on a package substrate according to techniques described herein, a package substrate can be produced that is smaller in size than a corresponding conventional industry standard package substrate. Consequently, a printed circuit board coupled with such a smaller package substrate can be reduced in size, and a chip attached to such a package substrate can be located closer to a processor coupled to the chip. In this way, the length of conductive pathways formed on the printed circuit board can be reduced and signal frequencies can increase. Additionally, the conductive pathways of the printed circuit board, can, in some situations, be non-matched because the delays associated with the conductive pathways can be reduced to the point where delay matching is not required for proper function. Further, lower cost printed circuit boards can be utilized due to the increased space on the printed circuit boards. For example, some embodiments herein can be implemented with printed circuit boards having staggered microvias and traces with widths of at least 0.08 mm, while refraining from the use of via in pad features and narrower trace widths. Accordingly, manufacturing costs can be reduced when producing the printed circuit boards according to embodiments described herein.

FIG. 1 is a diagram illustrating features of a printed circuit board 100 including an array of bond pads having a spacing that provides additional space for conductive pathways in accordance with an embodiment. The printed circuit board 100 can be coupled to a package substrate that includes a die. In an embodiment, the die can include one or more electronic components with integrated circuits that perform one or more functions, such as memory functions, processing functions, or both. In an illustrative embodiment, the die includes a memory chip. In some situations, the memory chip operates according to an industry standard, such as a DDRx industry standard. In embodiments where the printed circuit board 100 is coupled to a package substrate including a memory chip, the printed circuit board 100 can also be coupled to an additional package substrate having one or more processors, such that the memory chip is accessible to the one or more processors.

The printed circuit board 100 also includes a number of features, such as one or more conductive pathways and one or more bond pads. In particular, the printed circuit board 100 includes a bond pad 102 coupled to a conductive pathway 104. In some embodiments, the conductive pathway 104 couples the bond pad 102 to a bond pad 106. The bond pad 102, the conductive pathway 104, and the bond pad 106 are also referred to herein generally as features 102, 104, 106. Additionally, the conductive pathway 104 can couple the bond pad 102 to a supply voltage, a reference voltage, or to ground. The particular couplings of bond pads using conductive pathways are not shown in FIG. 1 for purposes of clarity. In an embodiment, the bond pad 102, the conductive pathway 104, and bond pad 106 include a metal. In an illustrative embodiment, the bond pad 102, the conductive pathway 104, and the bond pad 106 include copper, gold, nickel, or a combination thereof.

Although the features 102, 104, 106 are shown in FIG. 1 as being on a single surface of the printed circuit board 100, in some embodiments, the printed circuit board 100 has multiple layers and the features 102, 104, 106 can be formed on different surfaces of the printed circuit board 100. In one example, the bond pad 102 is formed on one surface of the printed circuit board 100, while the bond pad 106 is formed on a different surface of the printed circuit board 100 that is substantially parallel to the surface on which the bond pad 102 is formed. In some situations, the conductive pathway 104 is formed on the same layer as the bond pad 102 and/or the bond pad 106, while in other situations, the conductive pathway 104 is formed on a different layer than the layer on which the bond pad 102 and the bond pad 106 are formed. Conductive vias (not shown) may be used between different layers of conductive pathways separated by the insulating material used in the construction of the printed circuit board.

In a particular embodiment, the length of the conductive pathways of the printed circuit board 100 can be reduced in length by reducing the pitch of the bonding pads on the package substrate from 0.8 mm to 0.5 mm or some other reduction in pitch of the bonding pads. In order to avoid use of smaller widths of conductive pathways or other printed circuit board features that increase fabrication costs, it may be necessary to modify the arrangement of the bonding articles on a package substrate to provide space for conductive pathways on the printed circuit board. In some situations, the lengths of the conductive pathways of the printed circuit board 100 are matched. In other situations, the lengths of the conductive pathways of the printed circuit board 100 are non-matched. In the case where matched lengths of conductive pathways are required, it may be necessary to allow additional room for the conductive pathways by further modifying the arrangement of the bonding articles or bond pads on the package substrate.

In various embodiments, the bond pads are arranged in an array having a number of rows and columns. In the illustrative embodiment of FIG. 1, a portion of the bond pads are arranged in an array having rows A-I and columns 1-6. In some situations, each of the bond pads has a particular electrical connection. For example, as described previously, the bond pad 102 can be coupled to the bond pad 106 via the conductive pathway 104. In other situations, some bond pads, such as bond pad 108 have no electrical connection to any other feature of the printed circuit board 100. These bond pads having no electrical connection to any other feature of the printed circuit board 100 are referred to herein as "no-connect" bond pads and correspond to a "no-connect" bonding article of a package substrate coupled to the printed circuit board 100. In another example, some bond pads, such as bond pad 112 are connected to a power supply voltage. In an additional example, some bond pads, such as bond pad 110 are connected to a ground. In particular embodiments, the arrangement of the bond pads and the electrical connections of the bond pads are based on requirements of an industry standard.

In an embodiment, each of the rows of bond pads and each of the columns of the bond pads are separated by a space having a particular distance. In some situations, the distance between bond pads is expressed as the pitch between the bond pads. The pitch between the bond pads is referred to herein as a distance between a center of a first bond pad and a center of a second bond pad that is adjacent to the first bond pad. For example, the bond pads of Row A and Row B have a pitch 114 in the illustrative embodiment of FIG. 1. In some embodiments, the pitch between some adjacent rows of bond pads is larger than the pitch between other adjacent rows of bond pads. To illustrate, in some situations, the rows C and G are unoccupied. In these scenarios, the bond pads of adjacent rows B and D have a pitch 116 that has a larger value than the pitch 114 between the bond pads of adjacent rows A and B.

In an embodiment, the pitch 114 is no greater than 0.8 mm, no greater than 0.7 mm, or no greater than 0.6 mm. In another embodiment, the pitch 114 is at least 0.4 mm, at least 0.5 mm, or at least 0.6 mm. In an illustrative embodiment, the pitch 114 is included in a range of 0.3 mm to 1 mm. In another illustrative embodiment, the pitch 114 is included in a range of 0.4 mm to 0.7 mm. In an additional illustrative embodiment, the pitch 114 is approximately 0.5 mm.

Additionally, in an embodiment, the pitch 116 is no greater than 1.5 mm, no greater than 1.3 mm, or no greater than 1.1 mm. In a further embodiment, the pitch 116 is at least 0.7 mm, at least 0.8 mm, or at least 0.9 mm. In an illustrative embodiment, the pitch 116 is included in a range of 0.6 mm to 1.6 mm. In another illustrative embodiment, the pitch 116 is included in a range of 0.8 mm to 1.4 mm. In an additional illustrative embodiment, the pitch 116 is approximately 1 mm.

In various embodiments, the rows C and G of the array of bond pads optionally include bond pads, such as bond pad 118. In some embodiments, bond pads can be included in rows C and G of the array of bond pads to provide mechanical stability of the solder connection to the printed circuit board 100. The bond pads included in Rows C and G of the array of bond pads can be no-connect bond pads that do not have any electrical connection to other features of the printed circuit board 100. In these situations, the pitch between each row of the array of bond pads can be substantially the same. For example, the bond pads of adjacent Rows B and C of the array of bond pads can have a pitch 120 that is substantially the same as the pitch 114 of the bond pads of adjacent rows A and B of the array of bond pads when Row C of the array is occupied with bond pads. In a particular embodiment, one of Row C or Row G is occupied by no-connect bond pads, while the other of Row C or Row G is unoccupied.

Although, FIG. 1 illustrates an array of bond pads arranged on a portion of the printed circuit board 100, the printed circuit board 100 can include arrays of bond pads arranged on multiple sides of the printed circuit board 100. In some situations, additional arrays of bond pads disposed on the printed circuit board 100 have a substantially similar arrangement as other arrays of bond pads disposed on the printed circuit board 100. In other situations, at least one array of bond pads disposed on the printed circuit board 100 has an arrangement that is different from that of other arrays of bond pads disposed on the printed circuit board 100.

By forming an array of bond pads that includes at least one pair of adjacent rows with a larger pitch than other pairs of adjacent rows or that includes one or more rows of no-connect bond pads, the size of the printed circuit board 100 can decrease with respect to the size of conventional printed circuit boards by allowing the use of a smaller pitch between bond pads. In particular, the number of conductive pathways and the electrical connections made with the conductive pathways for a particular layout of features of printed circuit boards can be maintained, while reducing the spacing between the bond pads and reducing the size of the printed circuit boards. Additionally, as the size of the printed circuit boards decreases, the length of the conductive pathways also decreases because the distance between the features of the printed circuit boards being coupled to each other decreases. Thus, the signal routes are shorter and signals can travel from source to destination in less time. Further, more costly fabrication techniques for fabricating the printed circuit boards are not necessary to accommodate the specifications of an industry standard, such as a DDR industry standard that has been modified by the addition of no-connect bond pads to enable the use of a smaller pitch between bond pads.

Figure 2:
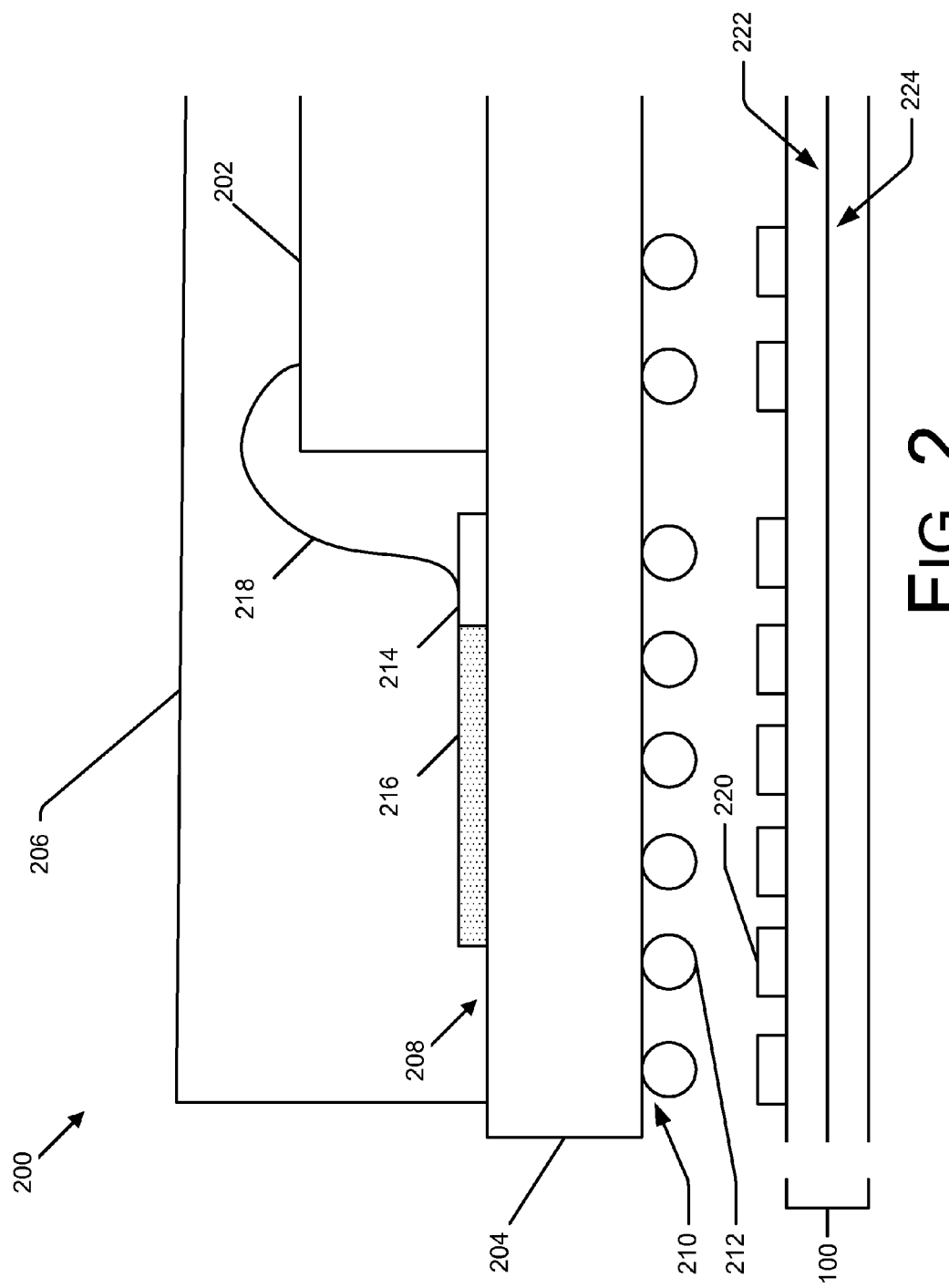
FIG. 2 is a diagram illustrating a cross-sectional view of an apparatus including a die attached to a package substrate including a planar surface having an array of bonding articles formed thereon, and a printed circuit board having an arrangement of bond pads that corresponds with the array of bonding articles in accordance with an embodiment.

FIG. 2 is a diagram illustrating one embodiment of an apparatus 200 including a die 202 attached to a package substrate 204, in which the package substrate can be mounted to a printed circuit board (e.g., printed circuit board 100). The die 202 can be configured as, for example, a processor chip, a memory chip, system on chip (SOC), etc. The apparatus 200 also includes an encapsulation layer 206 overlying the die 202 and at least a portion of the package substrate 204. In a particular embodiment, the encapsulation layer 206 includes a plastic material. For example, the encapsulation layer 206 can include an epoxy resin.

The package substrate 204 in the illustrative embodiment of FIG. 2 includes a first planar surface 208 and a second planar surface 210 that is substantially parallel to the first planar surface 208. The package substrate 204 can also include a number of pathways to connect features of the first planar surface 208 and the second planar surface 210, such as one or more through holes, one or more vias, or both. In an embodiment, the through holes and/or vias connecting features of the first planar surface 208 and the second planar surface 210 are at least partially filled with a conductive material, such as copper, gold, or a combination thereof.

In some embodiments, a bonding article 212 is formed on the second planar surface 210 in relation to a through hole or via of the package substrate 204. In some situations, the bonding article 212 is included in an array of bonding articles formed on the second planar surface 210, such as an array of bonding articles that corresponds to the array of bond pads illustrated in FIG. 1. In a particular embodiment, the bonding article 212 is included in an array of bonding articles that is formed on the second planar surface 210 in accordance with requirements of an industry standard. For example, the bonding article 212 can be included in an array of bonding articles arranged according to a DDRx industry standard. Additionally, the bonding article 212 can be included in an array of bonding articles that provides additional space for conductive pathways on the printed circuit board 100 that electrically couple the bonding articles of the array to specified features of the printed circuit board 100. To illustrate, the array of bonding articles that includes the bonding article 212 can include one or more first pairs of adjacent rows that have a pitch that is greater than one or more second pairs of adjacent rows. In another situation, the array of bonding articles that includes the bonding article 212 can include one or more rows of no-connect bonding articles to provide additional space for conductive pathways formed on the printed circuit board 100. In a particular illustrative embodiment, the bonding article 212 includes a ball formed from solder.

The first planar surface 208 includes a number of features formed thereon. In some situations, the features are formed in accordance with a particular pattern. The features can include bond pads, conductive pathways, or both. For example, in the illustrative embodiment of FIG. 2, a bond pad 214 and a conductive pathway 216 are formed on the first planar surface 208. In an embodiment, the bond pad 214, the conductive pathway 216, or both are formed from one or more metals, such as copper, gold, nickel, or a combination thereof. The apparatus 200 also includes one or more bonding wires, such as bonding wire 218, coupled to bonding pads disposed on the first planar surface 208. In an illustrative embodiment, the bonding wire 218 is formed from a metal, such as copper, gold, aluminum, platinum, or a combination thereof. In the illustrative embodiment of FIG. 2, the bonding wire 218, the bond pad 214, the conductive pathway 216, one or more through holes or one or more vias of the package substrate 204, and the bonding article 212 form an electrical path to carry signals between the die 202 and the printed circuit board 100.

Although the package substrate 204 of FIG. 2 is shown as having a single layer, in other embodiments, the package substrate 204 has multiple layers. In one example, the package substrate 204 can have 2 layers and in another example, the package substrate 204 can have 4 layers. In some situations, the features of the package substrate 204 are disposed on different layers of the package substrate 204. For example, conductive pathways, such as the conductive pathway 216 can be formed on multiple layers of the package substrate 204. Bond pads, such as the bond pad 214, can also be formed on multiple layers of the package substrate 204.

Additionally, a number of bond pads are formed on the printed circuit board 100. To illustrate, a bond pad 220 is formed on a surface of a first layer 222 of the printed circuit board 100. In an embodiment, the bond pads are arranged in an array, such as the array of bond pads illustrated in FIG. 1. In a particular embodiment, at least a portion of the bond pads of the printed circuit board 100 correspond to a bonding article of the package substrate 204. In the illustrative example of FIG. 2, the bond pad 220 of the printed circuit board 100 corresponds to the bonding article 212 of the package substrate 204. When the package substrate 204 is bonded to the printed circuit board 100, bonding articles of the package substrate 204 are contacted with corresponding bond pads of the printed circuit board 100 to form an electrical connection between features of the package substrate 204 and features of the printed circuit board 100.

In an embodiment, the printed circuit board 100 is coupled to a number of package substrates that each include one or more electronic components, such as one or more memory chips, one or more processor chips, and so forth. The bond pads of the printed circuit board 100 can provide electrical connections between the components of the package substrates coupled to the printed circuit board 100. In a particular embodiment, the bond pads of the printed circuit board 100 are coupled to conductive pathways formed on one or more layers of the printed circuit board 100, such as the first layer 222 and a second layer 224. In some situations, the bond pads and conductive pathways are coupled using one or more vias.

In an illustrative embodiment, the bond pad 220 is coupled with the bonding article 212 and provides one of a number of electrical connections in conjunction with conductive pathways and vias of the package substrate 204 and the printed circuit board 100 between the die 202 and another electronic component coupled to the printed circuit board 100. In one example, the die 202 can include a memory chip and an additional electronic component of the printed circuit board 100 can include a processing chip. In this way, signals can travel between the memory chip and the processing chip.

FIG. 3 is a diagram illustrating an embodiment of a bonding article array 300 that is derived from the requirements of the DDR3 industry standard. The bonding article array 300 includes bonding articles arranged in a number of rows with each row having an alphabetical designation and a number of columns with each column having a numerical designation. In an embodiment, the bonding article array 300 is disposed in relation to a die, such as the die 202 of FIG. 2. Additionally, an array of bond pads that corresponds to the bonding article array 300 of FIG. 3 can be formed on a printed circuit board, such as the printed circuit board 100 of FIG. 1 and FIG. 2.

Each bonding article of the bonding article array 300 is associated with a label, such as VDDQ, NC, DQ13, and the like, which indicate the assignment of the respective bonding article. A portion of the bonding articles are associated with particular signals. Additionally, some of the bonding articles are no-connect bonding articles that are free from any electrical connection to another bonding article or to a die.

In particular, the A0, A1, A2, A3, A4, A5, A6, A7, A8, A9, A10, A11, A12, A13, A14, A15 bonding articles are associated with address inputs and provide the row address for ACTIVATE commands, and the column address and auto precharge bit (A10) for READ/WRITE commands, to select one location out of the memory array in the respective bank. The address inputs also provide the op-code during a LOAD MODE command and the address inputs are referenced to VREFCA. The BA0, BA1, BA2 bonding articles are associated with bank address inputs that define the bank to which an ACTIVATE, READ, WRITE, or PRECHARGE command is being applied. The bank address inputs also define which mode register is loaded during the LOAD MODE command. BA0, BA1, BA2 are referenced to VREFCA. Additionally, the CK and nCK bonding articles are associated with differential clock inputs. All control and address input signals are sampled on the crossing of the positive edge of CK and the negative edge of nCK. Output data strobe (DQS, nDQS) is referenced to the crossings of CK and nCK.

The nCS bonding article is associated with a chip select signal that enables (registered LOW) and disables (registered HIGH) the command decoder. All commands are masked when nCS is registered HIGH. The nCS signal provides for external rank selection on systems with multiple ranks and is considered part of the command code. The nCS signal is referenced to VREFCA. The LDM bonding article is associated with a signal that is a lower-byte, input mask signal for write data. Lower byte input data is masked when the LDM signal is sampled HIGH along with the input data during a write access. The LDM bonding article is input only and is designed to have a loading that matches that of the DQ and DQS bonding articles. The LDM signal is referenced to VREFDQ.

The ODT bonding article is associated with an on-die termination signal that enables (registered HIGH) and disables (registered LOW) termination resistance internal to the DDR3 die. When enabled in normal operation, the ODT signal is only applied to each of the following bonding articles: DQ [15:0], LDQS, nLDQS, UDQS, nUDQS, LDM, and UDM. The ODT input is ignored if disabled via the LOAD MODE command. The ODT signal is referenced to VREFCA. The nRAS, nCAS, and nWE bonding articles are associated with command inputs that define the command being entered (along with nCS) and are referenced to VREFCA. The nRESET bonding article is associated with a signal that is an active LOW CMOS input referenced to VSS. The nRESET input receiver is a CMOS input defined as a rail-to-rail signal with DC HIGH $\geq 0.8 \times VDD$ and DC LOW$\leq 0.2 \times VDDQ$. The nRESET assertion and desertion are asynchronous.

The UDM bonding article is associated with an input data mask signal that is an upper-byte, input mask signal for write data. The upper-byte input data is masked when the UDM signal is sampled HIGH along with that input data during a WRITE access. The UDM bonding article is input-only and has a loading to match that of the DQ and DQS bonding articles. The UDM signal is referenced to VREFDQ. The DQ0, DQ1, DQ2, DQ3, DQ4, DQ5, DQ6, DQ7 bonding articles are associated with data input/output signals including a lower byte of a bidirectional data bus and are referenced to VREFDQ. The DQ8, DQ9, DQ10, DQ11, DQ12, DQ 13, DQ14, DQ15 bonding articles are associated with signals including an upper byte of the bidirectional data busy and are referenced to VREFDQ.

The LDQS and nLDQS bonding articles are associated with a lower byte data strobe signal that provides output with read data and is edge-aligned with read data. The lower byte data strobe signal provides input with write data and is center-aligned to write data. The UDQS and nUDQS bonding articles are associated with an upper byte data strobe signal that provides output with read data and is edge-aligned with read data. The upper byte data strobe signal also provides output with write data and is center-aligned to write data.

The VDD bonding articles are associated with a power supply having 1.5±0.075 V and the VDDQ bonding articles are associated with a DQ power supply having a voltage of 1.5±0.075 V. The VREFCA bonding article is associated with a reference voltage for control, command, and address signals and is maintained at all times including during self refresh. The VREFDQ bonding article is associated with a reference voltage for data signals and is maintained at all times excluding during self refresh. The VSS bonding articles are associated with ground and the VSSQ bonding articles are associated with a DQ ground. The ZQ bonding article is an external reference bonding article for output drive calibration and is tied to an external 240Ω resistor that is tied to VSSQ. The NC bonding articles are no-connect bonding articles that are unconnected to the die or to other bonding articles.

In the illustrative example of FIG. 3, the bonding articles are arranged to be derived from the requirements of the DDR3 industry standard. Thus, the electrical connections of the bonding articles in the bonding article array 300 include the electrical connections of the DDR3 industry standard. Additionally, the bonding article array 300 includes two additional rows of no-connect bonding articles, Row E and Row R. These additional rows of bonding articles allow for the pitch between pairs of adjacent rows to be less than 0.8 mm while providing additional space for conductive pathways coupling the bonding articles according to the assignments designated by the DDR3 standard.

Note that the description above incorporates use of the phrases "in an embodiment," or "in various embodiments," or the like, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments in accordance with the present disclosure be limited only by the claims and the equivalents thereof.

What is claimed is:

1. An apparatus comprising:
   a printed circuit board including a number of bond pads formed on a surface of the printed circuit board, wherein
      at least a portion of the bond pads are arranged in an array of bond pads,
      the array of bond pads has (i) a number of rows and (ii) a number of columns,
      respective bond pads of adjacent rows of the number of rows of the array of bond pads have a pitch of (i) at least 0.4 mm and (ii) no greater than 0.8 mm, and
      the array of bond pads includes at least (i) a first row of no-connect bond pads and optionally (ii) a second row of no-connect bond pads.

2. The apparatus of claim 1, further comprising:
   a package substrate including:
      a first surface,
      a second surface that is substantially parallel to the first surface,
      a number of bonding articles arranged in an array, wherein (i) at least a portion of the bonding articles arranged in the array each correspond with a respective bond pad of the array of bond pads and (ii) the number of bonding articles include a no-connect bonding article that corresponds with a no-connect bond pad of the first row of no-connect bond pads, and
   a die attached to the first surface.

3. The apparatus of claim 2, wherein connections of the bonding articles of the array of bonding articles are made according to an industry standard.

4. The apparatus of claim 3, wherein
   the die includes a synchronous dynamic random access memory device; and
   the industry standard is a double data rate (DDR) industry standard.

5. The apparatus of claim 2, wherein
   one or more first bonding articles of the array of bonding articles are coupled to a reference voltage;
   one or more second bonding articles of the array of bonding articles are coupled to a supply voltage; and
   one or more third bonding articles of the array of bonding articles are each coupled to a respective conductive pathway.

6. The apparatus of claim 2, further comprising:

an additional die;

an additional package substrate coupled to the die; and wherein at least a portion of the bond pads of the array of bond pads are coupled to a respective conductive pathway carrying signals from the die to the additional die.

7. The apparatus of claim 1, wherein the pitch of the respective bond pads of the adjacent rows of the number of rows of the bond pads in the array of bond pads is approximately 0.5 mm.

8. A printed circuit board comprising:

a number of bond pads formed on a surface of the printed circuit board, wherein at least a portion of the number of bond pads are arranged in an array of bond pads, the array of bond pads has (i) a number of rows and (ii) a number of columns, a first portion of the number of rows include a number of adjacent rows, the number of adjacent rows has a first pitch, a second portion of the number of rows include at least one pair of adjacent rows, the at least one pair of adjacent rows has a second pitch different from the first pitch, and the second pitch is greater than 0.5 mm and less than 1.5 mm.

9. The printed circuit board of claim 8, wherein a value of the second pitch is larger than a value of the first pitch.

10. The printed circuit board of claim 8, wherein the first pitch is included in a range of 0.3 mm to 0.7 mm, and the second pitch is included in a range of 0.8 mm to 1.4 mm.

11. The printed circuit board of claim 8, wherein the number of rows of the array of bond pads is greater than the number of columns of the array of bond pads.

12. The printed circuit board of claim 8, wherein each bond pad of the array of bond pads is coupled to a respective solder ball of a package substrate.

13. A printed circuit board comprising:

a number of bond pads formed on a surface of the printed circuit board, wherein at least a portion of the bond pads are arranged in an array of bond pads, the array of bond pads has (i) a number of rows and (ii) a number of columns, and respective bond pads of adjacent rows of the number of rows of the bond pads have a pitch of at least 0.4 mm and no greater than 0.8 mm; and a number of conductive pathways coupled to a portion of the bond pads of the array of bond pads.

14. The printed circuit board of claim 13, wherein the number of conductive pathways have a width of at least 0.08 mm.

15. The printed circuit board of claim 13, further comprising a number of staggered microvias formed between layers of the printed circuit board.

16. The printed circuit board of claim 13, wherein electrical connections of the array of bond pads are configured according to a modified version of the double data rate 3 (DDR3) industry standard.

17. The printed circuit board of claim 13, wherein lengths of the number of conductive pathways are non-matched.

18. The printed circuit board of claim 13, wherein lengths of the number of conductive pathways are matched.

19. The printed circuit board of claim 13, wherein the pitch of the respective bond pads of the adjacent rows of the number of rows of the bond pads is included in a range of 0.4 to 0.7 mm.

20. The printed circuit board of claim 13, wherein the array of bond pads includes at least one row of no-connect bond pads.

* * * * *